US010068834B2

(12) United States Patent
Haney et al.

(10) Patent No.: US 10,068,834 B2
(45) Date of Patent: Sep. 4, 2018

(54) FLOATING BOND PAD FOR POWER SEMICONDUCTOR DEVICES (71) Applicant: Cree, Inc., Durham, NC (US)

(72) Inventors: Sarah Kay Haney, Cary, NC (US); Brett Hull, Raleigh, NC (US); Daniel Namishia, Wake Forest, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/783,644

(22) Filed: Mar. 4, 2013

(65) Prior Publication Data
US 2014/0246790 A1   Sep. 4, 2014

(51) Int. Cl.
H01L 23/48      (2006.01)
H01L 21/50      (2006.01)
(Continued)

(52) U.S. Cl.
CPC ............. *H01L 23/48* (2013.01); *H01L 21/50* (2013.01); *H01L 24/06* (2013.01); *H01L 24/05* (2013.01);
(Continued)

(58) Field of Classification Search
CPC ............. H01L 29/0634; H01L 29/7802; H01L 29/7804; H01L 27/0255; H01L 24/02; H01L 24/03; H01L 2224/13026; H01L 2224/14104; H01L 2223/6644; H01L 21/4853; H01L 21/4885; H01L 33/62; H01L 2224/04042; H01L 23/48; H01L 24/06; H01L 21/50; H01L 2924/10161; H01L 29/74; H01L 2224/05553;
(Continued)

(56) References Cited

U.S. PATENT DOCUMENTS 4,803,541 A * 2/1989 Kouda .................. 257/786
5,726,472 A   3/1998 Higashida
(Continued)

FOREIGN PATENT DOCUMENTS

EP   1783834 A2   5/2007
JP   2004014707 A * 1/2004 ............. H01L 24/05

OTHER PUBLICATIONS

International Search Report and Written Opinion for PCT/US2014/017663, dated Apr. 24, 2014, 14 pages.
(Continued)

*Primary Examiner* — Bitew Dinke
(74) *Attorney, Agent, or Firm* — Anthony J. Josephson (57) ABSTRACT Embodiments of a semiconductor device including a floating bond pad are disclosed. In one preferred embodiment, the semiconductor device is a power semiconductor device. In one embodiment, the semiconductor device includes a substrate that includes an active area and a control contact area, a first bond pad on the active area, a floating control bond pad on the control contact area and laterally extending over a portion of the first bond pad, and a dielectric between the portion of the first bond pad and the floating control bond pad. The floating control bond pad enables the active area to extend below the floating control bond pad, which in turn decreases a size of the power semiconductor device for a particular rated current or, conversely, increases a size of the active area and thus a rated current for a particular semiconductor die size.

22 Claims, 10 Drawing Sheets (51) Int. Cl.
    *H01L 29/417*      (2006.01)
    *H01L 29/423*      (2006.01)
    *H01L 23/00*      (2006.01)
    *H01L 29/74*      (2006.01)
    *H01L 29/78*      (2006.01)

(52) U.S. Cl.
    CPC .............. *H01L 24/29* (2013.01); *H01L 24/48* (2013.01); *H01L 24/83* (2013.01); *H01L 29/41741* (2013.01); *H01L 29/42308* (2013.01); *H01L 29/42372* (2013.01); *H01L 29/74* (2013.01); *H01L 29/7802* (2013.01); *H01L 2224/02166* (2013.01); *H01L 2224/04042* (2013.01); *H01L 2224/056* (2013.01); *H01L 2224/05553* (2013.01); *H01L 2224/05554* (2013.01); *H01L 2224/0603* (2013.01); *H01L 2224/0612* (2013.01); *H01L 2224/06102* (2013.01); *H01L 2224/29101* (2013.01); *H01L 2224/48091* (2013.01); *H01L 2224/48463* (2013.01); *H01L 2224/49107* (2013.01); *H01L 2224/73265* (2013.01); *H01L 2224/83801* (2013.01); *H01L 2924/00014* (2013.01); *H01L 2924/10161* (2013.01); *H01L 2924/10253* (2013.01); *H01L 2924/10272* (2013.01); *H01L 2924/1301* (2013.01); *H01L 2924/1305* (2013.01); *H01L 2924/1306* (2013.01); *H01L 2924/13091* (2013.01); *H01L 2924/38* (2013.01)

(58) Field of Classification Search
    CPC . H01L 2224/02166; H01L 2224/73265; H01L 2924/1306; H01L 29/42308; H01L 29/42372
    See application file for complete search history.

(56) References Cited

U.S. PATENT DOCUMENTS

| | | | |
|---|---|---|---|
| 5,962,919 A | 10/1999 | Liang et al. | |
| 6,261,944 B1 | 7/2001 | Mehta et al. | |
| 6,410,435 B1 | 6/2002 | Ryan | |
| 6,682,999 B1 | 1/2004 | Mucha | |
| 6,713,835 B1 | 3/2004 | Horak et al. | |
| 6,890,828 B2 | 5/2005 | Horak et al. | |
| 7,541,672 B2* | 6/2009 | Satou et al. | 257/692 |
| 7,709,861 B2 | 5/2010 | Madhani et al. | |
| 7,719,115 B2 | 5/2010 | Seta | |
| 7,843,044 B2* | 11/2010 | Takahashi et al. | 257/673 |
| 8,314,498 B2 | 11/2012 | Hutto et al. | |
| 8,541,818 B2* | 9/2013 | Wu et al. | 257/194 |
| 2003/0153103 A1 | 8/2003 | Perry | |
| 2004/0185622 A1* | 9/2004 | Williams et al. | 438/270 |
| 2006/0131645 A1* | 6/2006 | Kaneko | 257/330 |
| 2007/0034943 A1* | 2/2007 | Kushiyama et al. | 257/330 |
| 2007/0052015 A1* | 3/2007 | Miura et al. | 257/331 |
| 2007/0107827 A1* | 5/2007 | Takahashi | B32B 41/00 156/64 |
| 2008/0026594 A1* | 1/2008 | Sachdev et al. | 438/763 |
| 2008/0252254 A1* | 10/2008 | Osada | 320/108 |
| 2008/0303081 A1* | 12/2008 | Hshieh | 257/328 |
| 2009/0020856 A1 | 1/2009 | Collins et al. | |
| 2009/0236728 A1* | 9/2009 | Satou et al. | 257/692 |
| 2009/0269886 A1* | 10/2009 | Yamazaki | H01L 21/6835 438/121 |
| 2010/0044749 A1* | 2/2010 | Kitamura et al. | 257/124 |
| 2010/0184252 A1* | 7/2010 | Okada | 438/99 |
| 2011/0133278 A1* | 6/2011 | Tokano et al. | 257/341 |
| 2011/0136310 A1* | 6/2011 | Grivna | 438/270 |
| 2011/0220992 A1* | 9/2011 | Inomata | 257/330 |
| 2012/0193748 A1* | 8/2012 | Yedinak et al. | 257/488 |
| 2012/0256193 A1* | 10/2012 | Hebert | H01L 23/49562 257/77 |
| 2012/0273916 A1* | 11/2012 | Yedinak et al. | 257/471 |
| 2013/0161633 A1* | 6/2013 | Nie et al. | 257/76 |
| 2014/0246790 A1* | 9/2014 | Haney et al. | 257/782 |

OTHER PUBLICATIONS

International Preliminary Report on Patentability for International Patent Application No. PCT/US2014/017663, dated Sep. 17, 2015, 11 pages.
Saraswat, "Scaling of Minimum Feature Size and Chip Area," Scaling of Interconnections, Copyright: 1999, 28 pages.
Examination Report for European Patent Application No. 14708754.8, dated Jun. 1, 2018, 10 pages.

\* cited by examiner

FLOATING BOND PAD FOR POWER SEMICONDUCTOR DEVICES

FIELD OF THE DISCLOSURE

The present disclosure relates to a bond pad for a semiconductor device and more particularly relates to a floating bond pad for a semiconductor device such as, for instance, a power semiconductor device.

BACKGROUND

Power semiconductor devices are utilized in most modern power applications. For example, power semiconductor devices are used in heating and lighting controls, AC and DC power supplies, and AC and DC motor drives. Power semiconductor devices include, for example, power Metal Oxide Semiconductor Field Effect Transistors (MOSFETs), power Bipolar Junction Transistors (BJTs), and power thyristors. Power semiconductor devices can be formed in various material systems. However, Silicon Carbide (SiC) power semiconductor devices such as those manufactured and sold by Cree, Inc. are particularly beneficial due to their superior performance. For example, SiC power semiconductor devices have lower specific on-resistance and faster switching than Silicon (Si) power semiconductor devices for the same breakdown voltage, higher current densities than Si power semiconductor devices, and higher temperature of operation than Si power semiconductor devices.

Typically, a power semiconductor device is a vertical device fabricated on a semiconductor die. The semiconductor die for the power semiconductor device includes an active area and a control contact area. The active area is an area of the semiconductor die in which active features (e.g., source and channel regions) of the power semiconductor device are fabricated. The control contact area is a non-active area of the semiconductor die used to provide electrical connection between a corresponding control bond pad and control regions (e.g., channel, gate, or base regions) of the power semiconductor device in the active region of the semiconductor die. During operation, the active region carries a large amount of current (e.g., 1 Amp (A), 5 A, 10 A, 20 A, 50 A, or higher); however, the control contact area carries only a small amount of current. As such, in order to maintain current density at an acceptable level, the active area is typically much larger than the control contact area. For a vertical power semiconductor device, a current rating of the power semiconductor device is proportional to a size of the active area of the semiconductor die. Thus, for a 2× increase in the rated current of the power semiconductor device, there is a 2× increase in the size of the active region.

In order to connect the power semiconductor device to an external package, bond pads are formed on the semiconductor die. Using a power MOSFET as an example, a source bond pad is typically formed over the active area of the semiconductor die. The source bond pad is electrically connected to source regions within the active area of the semiconductor die. In addition, a gate bond pad is formed over the control contact area. The gate bond pad is electrically connected to channel regions within the active area of the semiconductor die. Lastly, for a vertical power MOSFET, a drain bond pad is formed on a bottom surface of the semiconductor die. During packaging, the bond pads are electrically connected to a package. In particular, the source and gate bond pads are typically connected to the package via corresponding wire bonds.

As power semiconductor devices evolve, there is increasing demand to decrease the size of the semiconductor die and thus the cost of the power semiconductor devices. As such, there is a need for systems and methods for reducing the size of the semiconductor die for power semiconductor devices.

SUMMARY

Embodiments of a semiconductor device including a floating bond pad are disclosed. In one preferred embodiment, the semiconductor device is a power semiconductor device such as, for example, a power Metal Oxide Semiconductor Field Effect Transistor (MOSFET), a power Bipolar Junction Transistor (BJT), or a power thyristor. However, the semiconductor device is not limited thereto. In one embodiment, the semiconductor device includes a substrate that includes an active area and a control contact area, a first bond pad on the active area, a floating control bond pad on the control contact area and laterally extending over a portion of the first bond pad, and a dielectric between the portion of the first bond pad and the floating control bond pad. The floating control bond pad enables the active area to extend below the floating control bond pad, which in turn decreases a size of the power semiconductor device for a particular rated current or, conversely, increases a size of the active area and thus a rated current for a particular semiconductor die size.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of a semiconductor device including a floating bond pad are disclosed. In one preferred embodiment, the semiconductor device is a power semiconductor device such as, for example, a power Metal Oxide Semiconductor Field Effect Transistor (MOSFET), a power Bipolar Junction Transistor (BJT), or a power thyristor. However, the semiconductor device is not limited thereto. For instance, the semiconductor device may alternatively be a Radio Frequency (RF) device. Further, while the embodiments described herein focus on a vertical device, the floating bond pad disclosed herein may also be used for lateral devices.

Figure 1A:
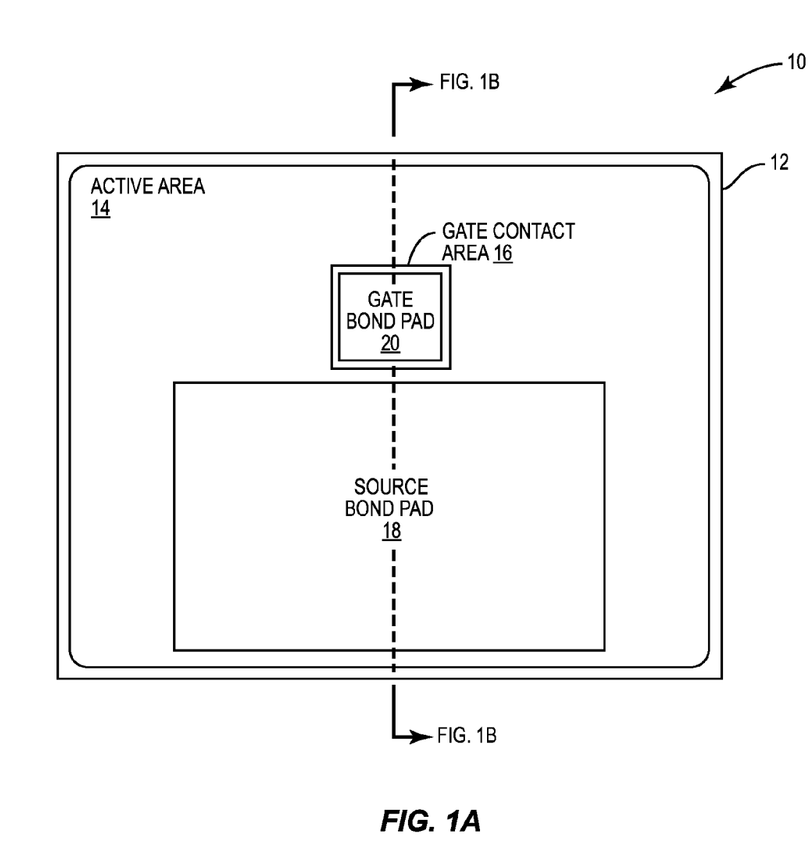
FIGS. 1A through 1C illustrate a conventional power semiconductor device.
Figure 1B:
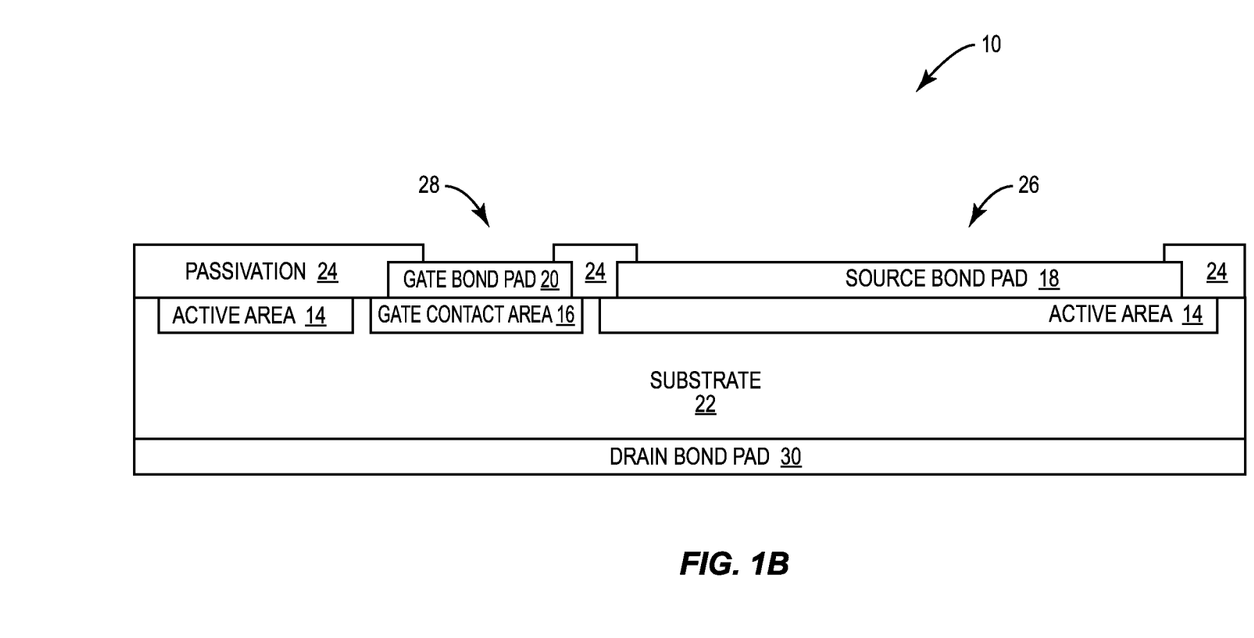
Figure 1C:
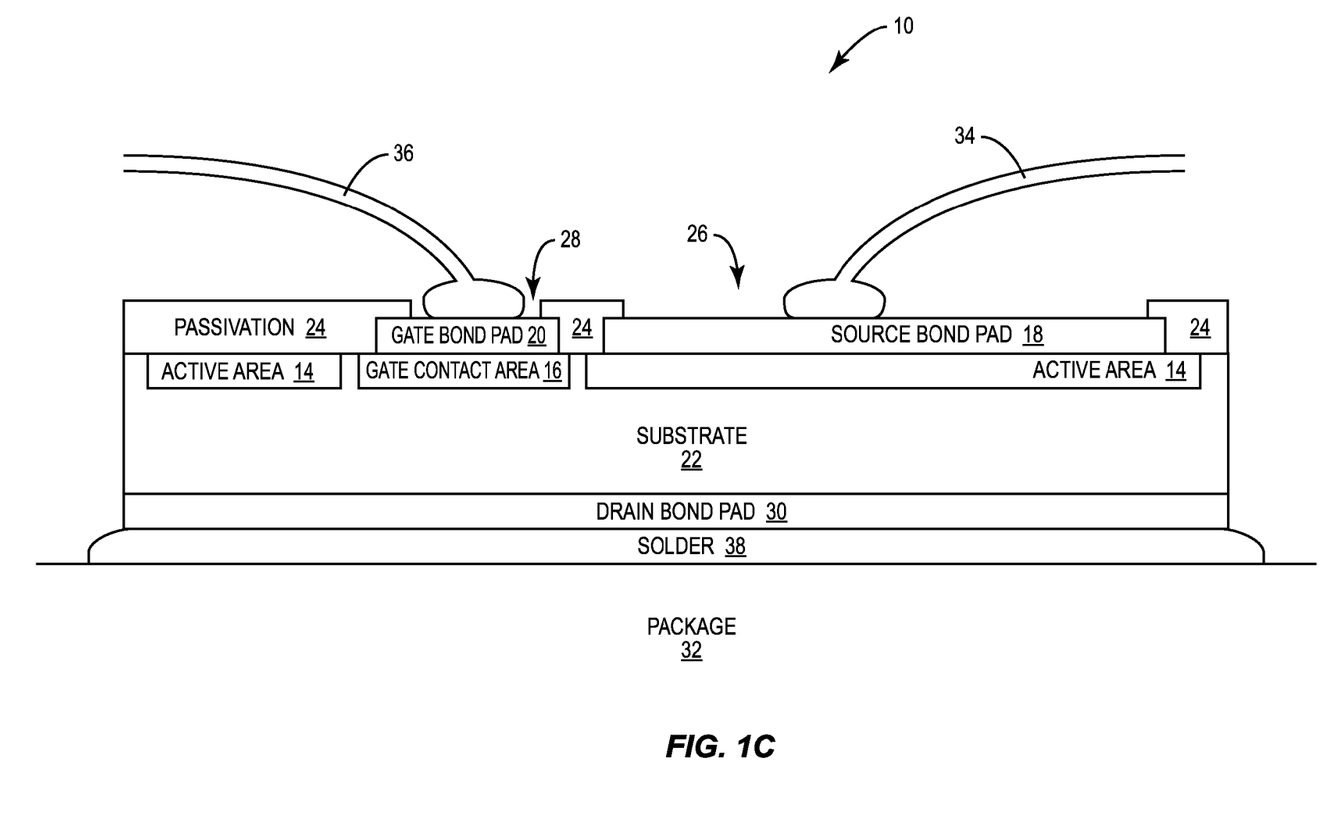

Before describing embodiments of a semiconductor device including a floating bond pad, a brief discussion of a conventional power semiconductor device is beneficial. In this regard, FIGS. 1A through 1C illustrate a conventional power semiconductor device 10 (hereinafter simply "power semiconductor device 10"). In this example, the power semiconductor device 10 is a power MOSFET. FIG. 1A is a top down view of the power semiconductor device 10, which is fabricated on a semiconductor die 12. As illustrated, the semiconductor die 12 includes an active area 14 and a gate contact area 16. The active area 14 includes active features of the power semiconductor device 10, which for the power MOSFET are source regions and channel regions of the power MOSFET. The gate contact area 16 is a non-active area of the semiconductor die 12 that, as discussed below, is utilized for electrical connection between a gate bond pad 20 and gate regions of the power semiconductor device 10 within the active area 14. The active area 14 carries a large amount of current (e.g., 1 Amp (A), 5 A, 10 A, 20 A, 50 A, or more) whereas the gate contact area 16 only carries a small amount of current.

A source bond pad 18 is formed on, and typically directly on, at least a portion of the active area 14 of the semiconductor die 12. Typically, the active area 14 includes the source and channel regions of the power semiconductor device 10 as well as one or more metallization, dielectric, and/or passivation layers between the source and channel regions and the source bond pad 18. In this case, conductive vias in the active area 14 are utilized to electrically connect the source bond pad 18 to the source regions in the active area 14. For example, conductive vias may electrically connect the source bond pad 18 to metal source contacts formed directly on the source regions in the active area 14. The gate bond pad 20 is formed on, and typically directly on, at least a portion of the gate contact area 16 of the semiconductor die 12. Typically, the gate contact area 16 is part of or is electrically connected to a gate metal that electrically connects to appropriate locations in the active area 14. For example, the gate metal is typically electrically connected to gate, or channel, regions within the active area 14. While not illustrated, one or more passivation layers may be formed over the semiconductor die 12 where openings to the source bond pad 18 and the gate bond pad 20 are formed in the one or more passivation layers.

FIG. 1B is a cross-sectional view of the conventional power semiconductor device 10 along the dashed line shown in FIG. 1A. As illustrated, the power semiconductor device 10 includes a substrate 22, where the active area 14 and the gate contact area 16 are at a first surface of the substrate 22. The source bond pad 18 is formed on at least a portion of the active area 14. Similarly, the gate bond pad 20 is formed on at least a portion of the gate contact area 16. One or more passivation layers 24 are formed over the power semiconductor device 10. Openings 26 and 28 in the one or more passivation layers 24 are formed over the source bond pad 18 and the gate bond pad 20, respectively. Because the conventional power semiconductor device 10 is a vertical device, a drain bond pad 30 is formed on a second surface of the substrate 22.

Lastly, FIG. 1C illustrates electrical connection of the power semiconductor device 10 to a package 32. As illustrated, the source bond pad 18 and the gate bond pad 20 are electrically connected to the package 32 via wire bonds 34 and 36, respectively. The drain bond pad 30 is mechanically and electrically connected to the package 32 via solder 38. In operation, current flows from the source bond pad 18 through the active area 14 and to the drain bond pad 30 under control of a voltage applied to the gate bond pad 20. Because the current flowing through the active area 14 is large, the size of the active area 14 is large enough to maintain current density below an acceptable level. As a rated current of the power semiconductor device 10 increases, the size of the active area 14 also increases.

One issue with the conventional power semiconductor device 10 is that the gate bond pad 20 must have at least a minimum size required for connection of the wire bond 36. Since only a small amount of current flows from the gate bond pad 20 to the gate contact area 16 of the semiconductor die 12, the minimum size of the gate bond pad 20 is significantly larger than a minimum size needed for the gate contact area 16. As a result, a significant amount of the semiconductor die 12 under the gate bond pad 20 is wasted space. As discussed below in detail, the floating bond pad disclosed herein reduces this wasted space by allowing the space under the gate bond pad 20 that would be wasted in the conventional power semiconductor device 10 to be used as part of the active area 14.

Figure 2A:
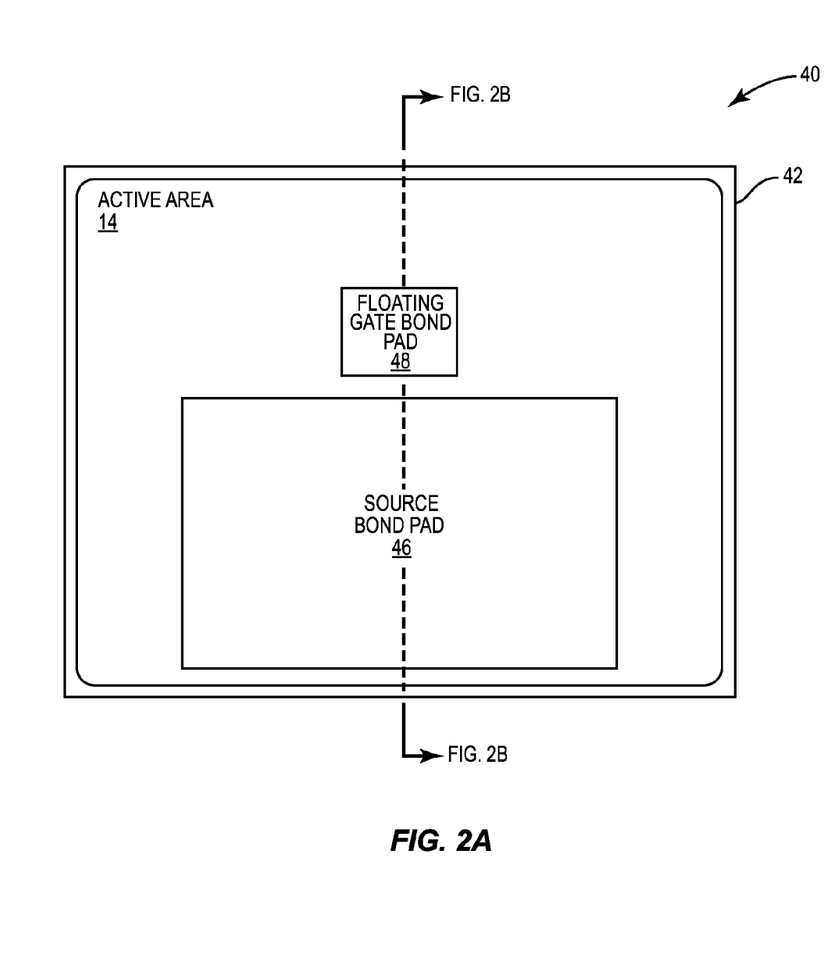
FIGS. 2A through 2C illustrate a power semiconductor device that includes a floating bond pad according to one embodiment of the present disclosure.
Figure 2B:
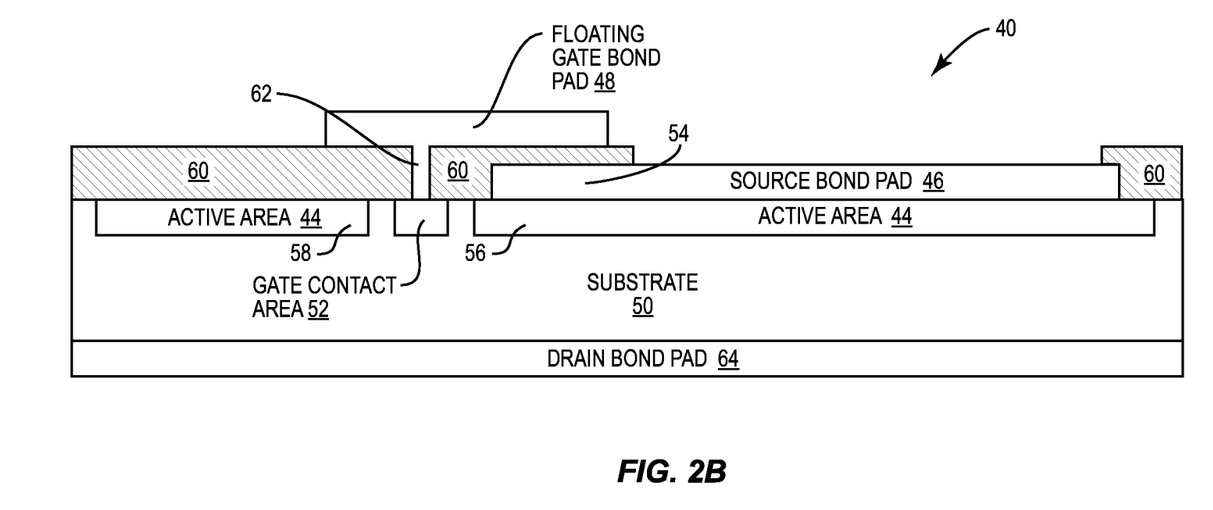
Figure 2C:
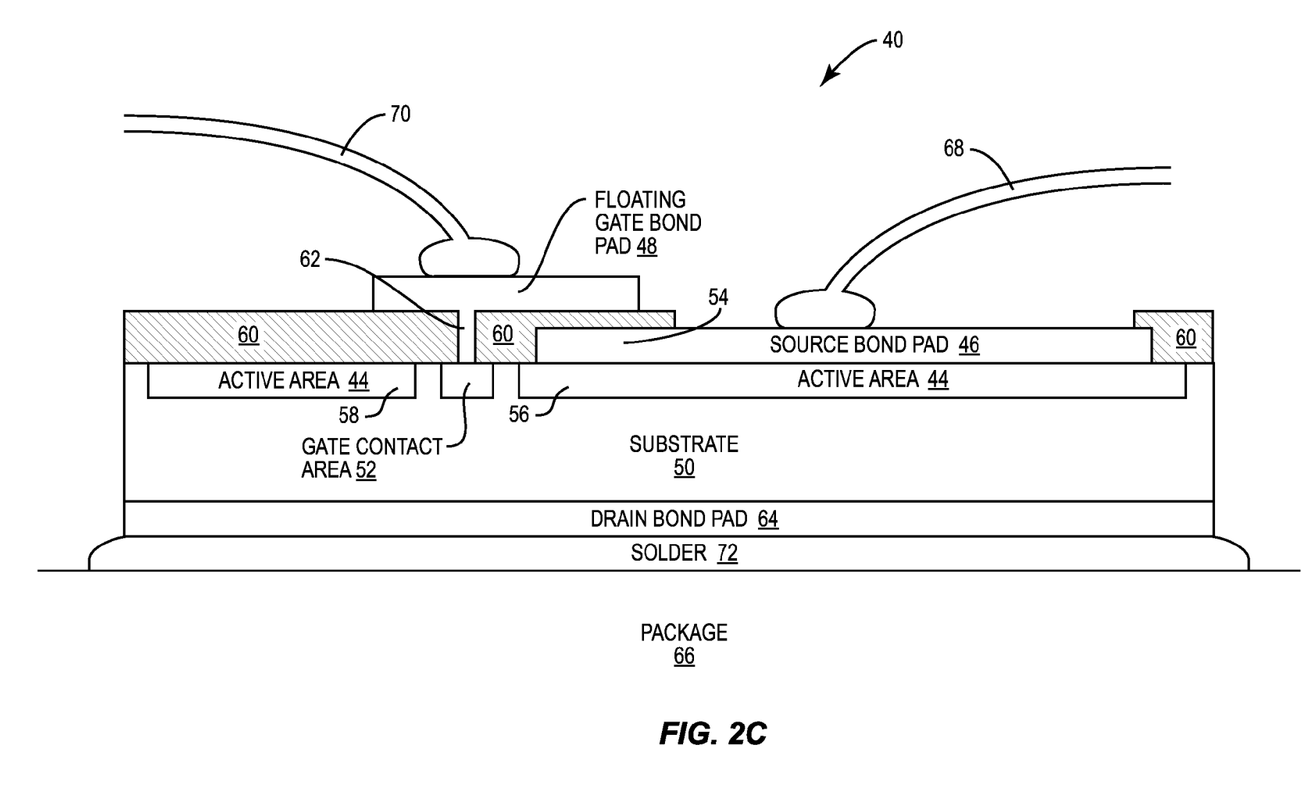

In this regard, FIGS. 2A through 2C illustrate a power semiconductor device 40 that includes a floating bond pad according to one embodiment of the present disclosure. In this example, the power semiconductor device 40 is a power MOSFET. Again, the present disclosure is not limited thereto. The power semiconductor device 40 may be any type of power semiconductor device such as, for example, a power BJT, a power thyristor, or the like. Further, the floating bond pad disclosed herein is not limited to power semiconductor devices and may be used for other types of semiconductor devices such as, for example, RF semiconductor devices. Still further, while the embodiments described below are for vertical devices, the floating bond pad disclosed herein may be used for lateral devices (e.g., lateral MOSFETs, lateral BJTs, or the like).

FIG. 2A is a top-down view of the power semiconductor device 40 according to one embodiment of the present disclosure. As illustrated, the power semiconductor device 40 is fabricated on a semiconductor die 42 that includes an active area 44 and a gate contact area (not shown). The active area 44 is the area of the semiconductor die 42 in which active features of the power semiconductor device 40 are fabricated. For this embodiment where the power semiconductor device 40 is a power MOSFET, the active features include source regions and gate, or channel, regions. The active area 44 carries a large amount of current (e.g., 1 A, 5 A, 10 A, 20 A, 50 A, or more) whereas the gate contact area only carries a small amount of current.

A source bond pad 46 is formed on, and preferably directly on, at least a portion of the active area 44 of the semiconductor die 42. The active area 44 may include one or more metallization, dielectric, and/or passivation layers between the active features in the active area 44 of the semiconductor die 42 and the source bond pad 46. In this case, conductive vias in the active area 44 are utilized to electrically connect the source bond pad 46 to appropriate locations in the active area 44. For example, conductive vias may electrically connect the source bond pad 46 to metal source contacts formed directly on source regions in the active area 44. A floating gate bond pad 48 is formed over the gate contact area and, as discussed below in detail, laterally extends over a portion of the active area 44 and, in this embodiment, a portion of the source bond pad 46. Note, however, that in another embodiment, the floating gate bond pad 48 may extend over a portion of the active area 44 but not the source bond pad 46. The gate contact area, which is under and electrically connected to the floating gate bond pad 48, is part of or is electrically connected to a gate metal that electrically connects to appropriate locations in the active area 44. For example, in this embodiment, the gate contact area may be part of the gate metal, where the gate metal is electrically connected to gate, or channel, regions within the active area 44. While not illustrated, one or more passivation layers may be formed over the semiconductor die 42 where openings to the source bond pad 46 and the floating gate bond pad 48 are formed in the one or more passivation layers.

FIG. 2B is a cross-sectional view of the power semiconductor device 40 along the dashed line shown in FIG. 2A according to one embodiment of the present disclosure. As illustrated, the power semiconductor device 40 includes a substrate 50. In one embodiment, the substrate 50 may be formed by one or more layers of the same semiconductor material such as, for example, one or more layers of Silicon Carbide (SiC) or one or more layers of Silicon (Si). In another embodiment, the substrate 50 is an epitaxial structure that includes one or more layers of different semiconductor materials. The active area 44 and a gate contact area 52 are at a first surface of the substrate 50.

The source bond pad 46 is formed on, and preferably directly on, at least a portion of the active area 44. Notably, while not illustrated, the active area 44 may include one or more layers of various materials (e.g., metallization layer(s), dielectric layer(s), passivation layer(s)) between the active features formed in the active area 44 and the source bond pad 46. In this case, conductive vias in the active area 44 are utilized to electrically connect the source bond pad 46 to appropriate locations in the active area 44. The floating gate bond pad 48 is formed over the gate contact area 52 and extends laterally over a portion 54 of the source bond pad 46 and a corresponding portion 56 of the active area 44. In addition, in this embodiment, the floating gate bond pad 48 extends over a portion 58 of the active area 44 over which the source bond pad 46 is not formed. A dielectric layer 60 is located between the floating gate bond pad 48 and the portion 54 of the source bond pad 46 over which the floating gate bond pad 48 laterally extends to thereby electrically insulate the floating gate bond pad 48 and the source bond pad 46 from one another. In addition, in this embodiment, the dielectric layer 60 is between the floating gate bond pad 48 and the portion 58 of the active area 44 to thereby insulate the floating gate bond pad 48 and the active area 44 from one another.

The floating gate bond pad 48 is electrically connected to the gate contact area 52 by a conductive feature 62 that passes through the dielectric layer 60 to the gate contact area 52. In this embodiment, the conductive feature 62 is a conductive via. A conductive via is a via, or through-hole, that passes through, in this case, the dielectric layer 60 to the gate contact area 52 and is filled with a conductive material such as metal. A size of the floating gate bond pad 48 is at least a minimum size required to make an electrical connection (e.g., a wire bond connection) between the floating gate bond pad 48 and an external package. The minimum size for the floating gate bond pad 48 will depend on the technology used to make the electrical connection between the floating gate bond pad 48 and the external package. As one example, the minimum size of the floating gate bond pad 48 is at least 100 micrometer (μm)×100 μm. While not illustrated, one or more passivation layers may be formed over the power semiconductor device 40, where openings to the source bond pad 46 and the floating gate bond pad 48 are formed to enable electrical connection during packaging.

Because the power semiconductor device 40 is a vertical device, a drain bond pad 64 is formed on a second surface of the substrate 50.

The floating gate bond pad 48 allows the active area 44 to extend laterally under the floating gate bond pad 48. As a result, an amount of wasted space under the floating gate bond pad 48 is substantially reduced as compared to the wasted space under the gate bond pad 20 of the conventional power semiconductor device 10 (FIGS. 1A through 1C). In one embodiment, the reduction in the wasted space is at least 50%. In another embodiment, the reduction in the wasted space is at least 75% and may be 80% or higher. For example, for a 20 A power MOSFET, the wasted space under the gate bond pad 20 of the conventional power MOSFET is approximately 5% of the size of the active area 14. In contrast, for a 20 A power MOSFET, the wasted space under the floating gate bond pad 48 can be reduced to 1% or less of the size of the active area 44, which is a reduction of approximately 80%. As a result of the floating gate bond pad 48, the size of the semiconductor die 42 can be reduced while maintaining the same size for the active area 44, which in turn decreases the cost of the power semiconductor device 40. Conversely, the size of the active area 44 can be increased for a particular size of the semiconductor die 42, which in turn provides a higher rated current for a particular size of the semiconductor die 42.

FIG. 2C illustrates electrical connection of the power semiconductor device 40 to a package 66. As illustrated, the source bond pad 46 and the floating gate bond pad 48 are electrically connected to the package 66 via wire bonds 68 and 70, respectively. The drain bond pad 64 is mechanically and electrically connected to the package 66 via solder 72. Note that while the wire bonds 68 and 70 are used in this example, other mechanisms (e.g., brazing or soldering) may be used to electrically connect the source bond pad 46 and the floating gate bond pad 48 to the package 66. Likewise, while the solder 72 is used in this example, other mechanisms may be used to electrically connect the drain bond pad 64 to the package 66.

Figure 3A:
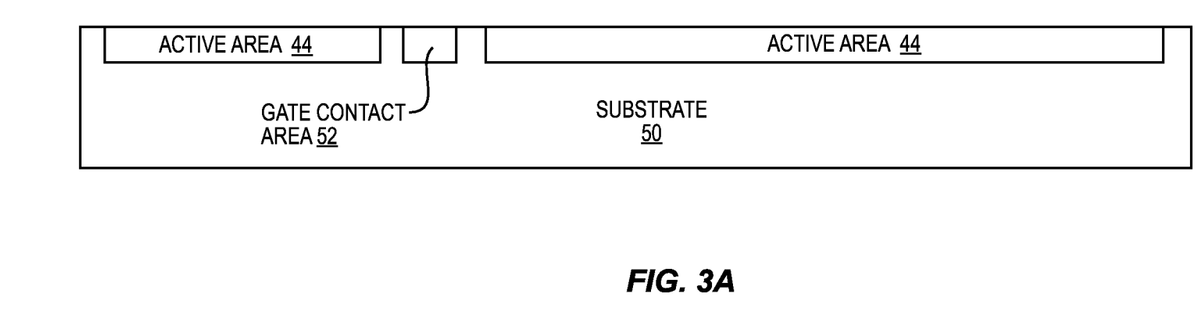
FIGS. 3A through 3G graphically illustrate a process for fabricating a power semiconductor device including a floating bond pad according to one embodiment of the present disclosure.
Figure 3B:
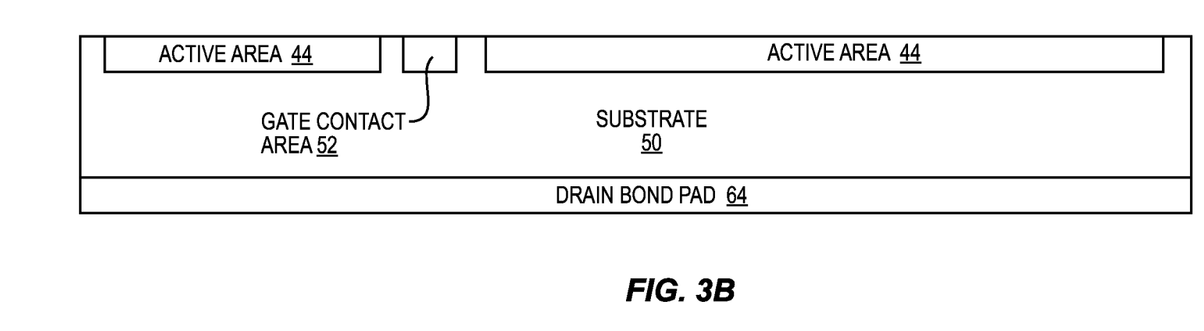
Figure 3C:
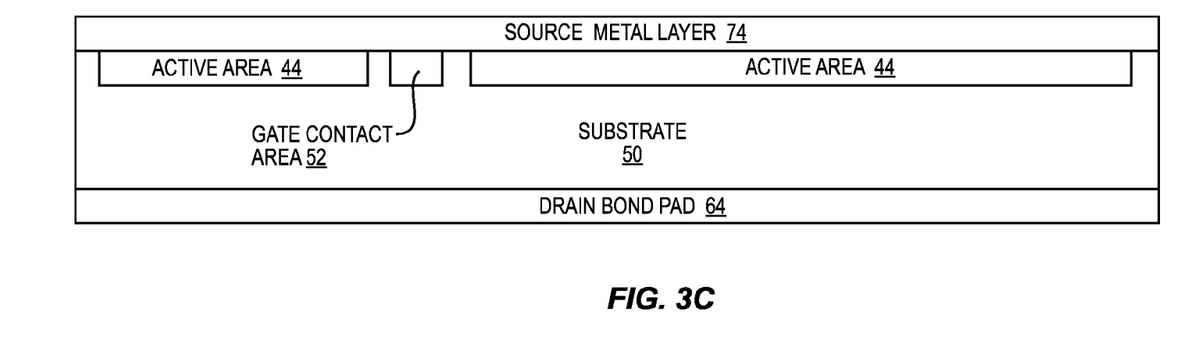
Figure 3D:
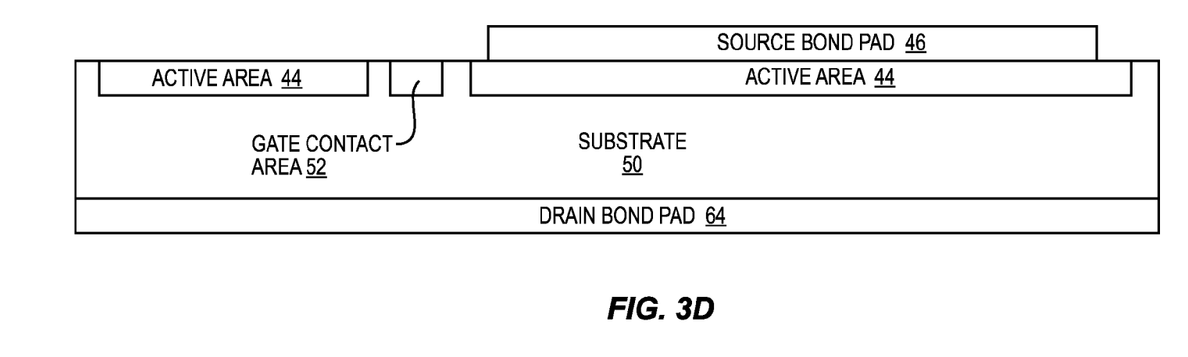

FIGS. 3A through 3G illustrate a process for fabricating the power semiconductor device 40 of FIGS. 2A through 2C according to one embodiment of the present disclosure. As illustrated in FIG. 3A, initially, the substrate 50 including the active area 44 and the gate contact area 52 is provided. Next, in this example, the drain bond pad 64 is formed on the second surface of the substrate 50 opposite the active area 44 and the gate contact area 52, as illustrated in FIG. 3B. The drain bond pad 64 is generally formed of a conductive material such as, for example, one or more metal layers. Next, a source metal layer 74 is formed on the first surface of the substrate 50 over the active area 44 and the gate contact area 52 as illustrated in FIG. 3C. The source metal layer 74 includes one or more metal layers of desired metal materials. The source metal layer 74 is then etched to form the source bond pad 46 over at least a portion of the active area 44 as illustrated in FIG. 3D.

Figure 3E:
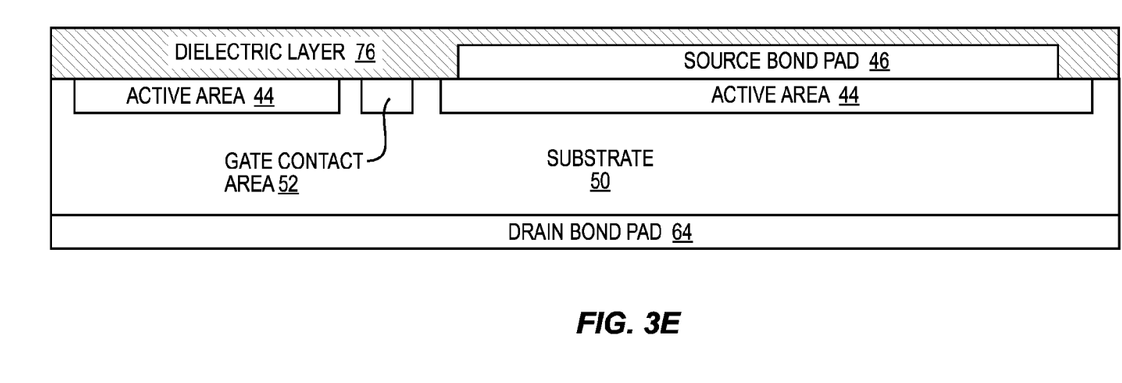

After the source bond pad 46 is formed, a dielectric layer 76 is formed over the source bond pad 46 and an exposed surface of the substrate 50 as illustrated in FIG. 3E. The dielectric layer 76 includes one or more layers of the same or different dielectric materials. The dielectric materials may include, for example, one or more oxides (e.g., Silicon Dioxide), one or more nitride (e.g., Silicon Nitride), one or more organic or inorganic based films (e.g., polyimide), or the like. In one embodiment, the dielectric layer 76 is deposited over the source bond pad 46 and the exposed surface of the substrate 50. The dielectric layer 76 may be deposited using, for example, Chemical Vapor Deposition (CVD). In another embodiment, the dielectric layer 76 is spin coated over the source bond pad 46 and the exposed surface of the substrate 50. Some examples of dielectric materials that can be spin coated are spin-on glasses, polyimide, and the like. In yet another embodiment, the dielectric layer 76 is sputtered over the source bond pad 46 and the exposed surface of the substrate 50. Note, however, that the techniques for forming the dielectric layer 76 given above are only examples. Any other suitable technique may be used.

Figure 3F:
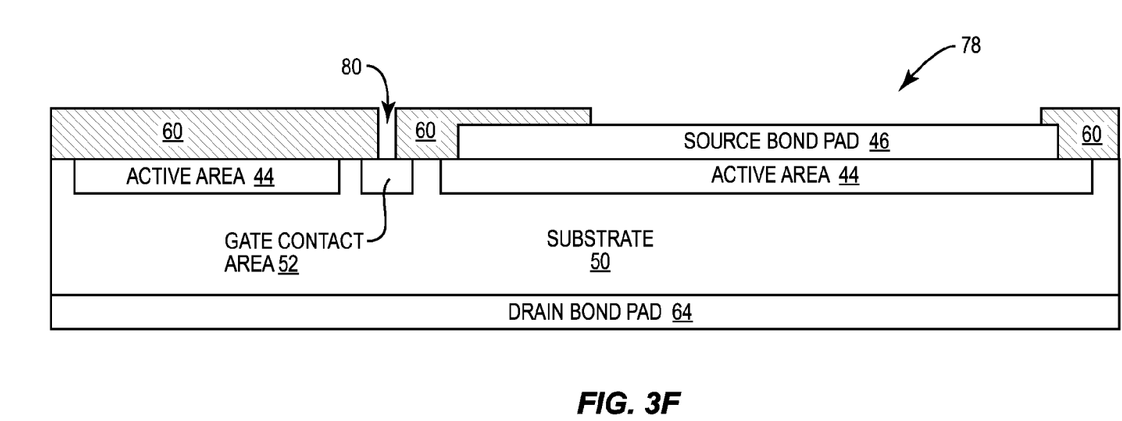
Figure 3G:
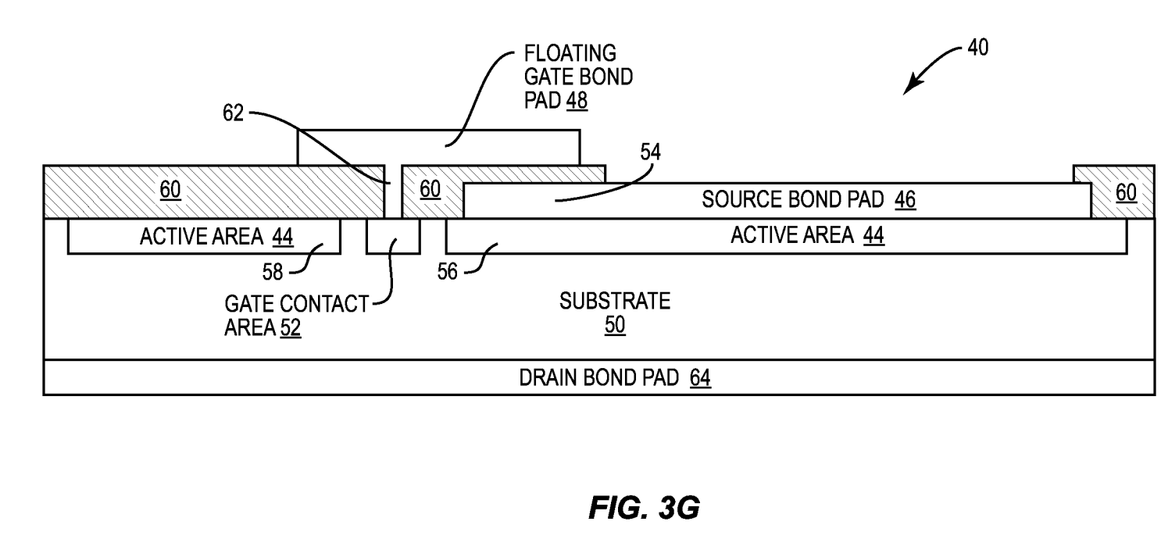

Next, the dielectric layer 76 is etched to create a first opening 78 over at least a portion of the source bond pad 46 and a second opening 80 over the gate contact area 52, thereby creating the dielectric layer 60 as illustrated in FIG. 3F. Lastly, the floating gate bond pad 48 is formed over the dielectric layer 60 as illustrated in FIG. 3G. The floating gate bond pad 48 is over the gate contact area 52 and laterally extends over the portion 56 of the active area 44. Further, the floating gate bond pad 48 is electrically connected to the gate contact area 52 by the conductive feature 62. The conductive feature 62 may be formed by depositing an appropriate material (e.g., the same metal used for the floating gate bond pad 48) within the second opening 80. Note that the floating gate bond pad 48 may more specifically be formed by depositing a desired material for the floating gate bond pad 48 and patterning the desired material using a lift-off process. This is beneficial where the floating gate bond pad 48 is formed of the same metal as the source bond pad 46. Alternatively, the desired material for the floating gate bond pad 48 may be patterned by etching the desired material. This is beneficial if the floating gate bond pad 48 and the source bond pad 46 are formed of different metals.

Again, the process of FIGS. 3A through 3G is only one example of a process for fabricating the power semiconductor device 40 of FIGS. 2A through 2C. As another example, the power semiconductor device 40 of FIGS. 2A through 2C may be fabricated by first depositing and patterning a source metal layer to form the source bond pad 46, then depositing the dielectric layer 76, then depositing and pattering the floating gate bond pad 48 either by etch-back or lift (which may include forming conductive vias from the floating gate bond pad 48 to the gate contact area 52), and lastly etching or otherwise patterning the dielectric layer 76 to create an opening over at least a portion of the source bond pad 46.

The discussion above has focused on a power MOSFET. However, the present disclosure is not limited thereto. For example, a floating bond pad may alternatively be utilized as a base bond pad for a power BJT or similar control contact bond pad for a similar power semiconductor device. Further, while the embodiments described above are for a vertical device, the floating bond pad disclosed herein may also be used for a lateral device such as, for example, a lateral MOSFET or a lateral BJT.

Those skilled in the art will recognize improvements and modifications to the preferred embodiments of the present disclosure. All such improvements and modifications are considered within the scope of the concepts disclosed herein and the claims that follow.

What is claimed is:

1. A semiconductor die on which a semiconductor device is fabricated, comprising:
   a substrate comprising an active area and a control contact area;
   a first bond pad on at least a portion of the active area;
   a floating control bond pad over the control contact area and laterally extending over a portion of the first bond pad, wherein a size of the floating control bond pad is at least a minimum size required for an electrical connection from the floating control bond pad to a package and the floating control bond pad results in at least a 50% decrease in wasted space which results in an increase in space for the active area under the floating control bond pad; and a dielectric layer between the portion of the first bond pad and the floating control bond pad.

2. The semiconductor die of claim 1 wherein the dielectric layer is on the control contact area and laterally extends over at least the portion of the first bond pad such that the dielectric layer is between the control contact area and the floating control bond pad and between the portion of the first bond pad and the floating control bond pad, and the semiconductor die further comprises:

a conductive feature that electrically connects the floating control bond pad and the control contact area.

3. The semiconductor die of claim 1 wherein the semiconductor device is a power semiconductor device.

4. The semiconductor die of claim 3 wherein the power semiconductor device is one of a group consisting of: a power Metal Oxide Semiconductor Field Effect Transistor and a power Bipolar Junction Transistor.

5. The semiconductor die of claim 3 wherein the power semiconductor device is a vertical device, and the semiconductor die further comprises a third bond pad on a surface of the substrate opposite the first bond pad.

6. The semiconductor die of claim 1 wherein the semiconductor die is electrically coupled to the package via a plurality of bond pads comprising the first bond pad and the floating control bond pad.

7. The semiconductor die of claim 1 wherein the wasted space is under the floating control bond pad.

8. The semiconductor die of claim 1 wherein the floating control bond pad results in at least a 75% reduction in wasted space under the floating control bond pad.

9. A method of fabrication of a semiconductor device, comprising:

providing a substrate comprising an active area and a control contact area;

providing a first bond pad on at least a portion of the active area;

providing a dielectric layer on a first active area and directly on a second active area; and providing a floating control bond pad over the control contact area and laterally extending over a portion of the first bond pad, wherein a size of the floating control bond pad is at least a minimum size required for an electrical connection from the floating control bond pad to a package and the floating control bond pad results in at least a 50% decrease in wasted space which results in an increase in space for the active area under the floating control bond pad.

10. The method of claim 9 wherein providing the floating control bond pad comprises:

providing the dielectric layer over the first bond pad and an exposed surface of the substrate;

etching the dielectric layer to expose at least some of the first bond pad; and after etching the dielectric layer, providing the floating control bond pad on the dielectric layer such that the floating control bond pad is over the control contact area and laterally extends over the portion of the first bond pad.

11. The method of claim 10 wherein providing the dielectric layer comprises depositing the dielectric layer.

12. The method of claim 11 wherein depositing the dielectric layer comprises one of a group consisting of: depositing the dielectric layer via Chemical Vapor Deposition and sputtering the dielectric layer.

13. The method of claim 10 wherein providing the dielectric layer comprises spin-coating the dielectric layer.

14. The method of claim 9 wherein providing the floating control bond pad comprises:

providing the dielectric layer over the first bond pad and an exposed surface of the substrate;

providing the floating control bond pad on the dielectric layer such that the floating control bond pad is over the control contact area and laterally extends over the portion of the first bond pad; and after providing the floating control bond pad, etching the dielectric layer to expose at least some of the first bond pad.

15. The method of claim 9 wherein the semiconductor device is a power semiconductor device.

16. The method of claim 15 wherein the power semiconductor device is one of a group consisting of a power Metal Oxide Semiconductor Field Effect Transistor and a power Bipolar Junction Transistor.

17. The method of claim 15 wherein the power semiconductor device is a vertical device, and the method further comprises providing a third bond pad on a surface of the substrate opposite the first bond pad.

18. The method of claim 9 further comprising electrically connecting the semiconductor device to the package via a plurality of bond pads comprising the first bond pad and the floating control bond pad.

19. The method of claim 9 wherein the wasted space is under the floating control bond pad.

20. The method of claim 9 wherein the floating control bond pad results in at least a 75% reduction in wasted space under the floating control bond pad.

21. A semiconductor die, comprising:

a substrate having an active area;

a first bond pad on a first area of the semiconductor die;

a dielectric layer on a portion of the first bond pad; and a floating control bond pad on a second area of the semiconductor die and laterally extending over the dielectric layer on the portion of the first bond pad such that the floating control bond pad laterally extends over the portion of the first bond pad on the first area of the semiconductor die, wherein a size of the floating control bond pad is at least a minimum size required for an electrical connection from the floating control bond pad to a package and the floating control bond pad results in at least a 50% decrease in wasted space which results in an increase in space for the first area under the floating control bond pad.

22. The semiconductor die of claim 21 wherein the semiconductor die is electrically coupled with the package, and a first electrical connection is provided from the first bond pad to the package and a second electrical connection that is different from the first electrical connection is provided from the floating control bond pad to the package.

* * * * *